(12) United States Patent
de Boet

(10) Patent No.: US 8,891,214 B2
(45) Date of Patent: Nov. 18, 2014

(54) ESD PROTECTION CIRCUIT

(75) Inventor: Johannes Adrianus Maria de Boet, Beuningen (NL)

(73) Assignee: NXP, B.V., Eindhoven (NL)

( * ) Notice: Subject to any disclaimer, the term of this patent is extended or adjusted under 35 U.S.C. 154(b) by 278 days.

(21) Appl. No.: 13/450,536

(22) Filed: Apr. 19, 2012

(65) Prior Publication Data
US 2013/0107403 A1    May 2, 2013

(30) Foreign Application Priority Data

Apr. 20, 2011  (EP) .................................. 11163258

(51) Int. Cl.
*H02H 9/04* (2006.01)
*H01L 27/02* (2006.01)
*H03K 19/003* (2006.01)
(52) U.S. Cl.
CPC ........... *H02H 9/044* (2013.01); *H01L 27/0259* (2013.01); *H03K 19/00315* (2013.01)
USPC .......................................................... 361/56
(58) Field of Classification Search
USPC ........................................................... 361/56
See application file for complete search history.

(56) References Cited

U.S. PATENT DOCUMENTS

| | | | |
|---|---|---|---|
| 6,466,423 B1 * | 10/2002 | Yu ..................................... | 361/56 |
| 7,838,937 B1 | 11/2010 | Walker et al. | |
| 2005/0083618 A1 | 4/2005 | Steinhoff et al. | |
| 2006/0043487 A1 | 3/2006 | Pauletti et al. | |
| 2007/0228475 A1 | 10/2007 | Burdeaux et al. | |
| 2008/0093624 A1 | 4/2008 | Chen et al. | |
| 2009/0213506 A1 * | 8/2009 | Zhan et al. ....................... | 361/56 |
| 2009/0267147 A1 * | 10/2009 | De Boet et al. ................ | 257/337 |

FOREIGN PATENT DOCUMENTS

| | | |
|---|---|---|
| WO | 01/20680 A1 | 3/2001 |
| WO | 2006/072148 A1 | 7/2006 |

OTHER PUBLICATIONS

Extended European Search Report for European patent appln. No. 11163258.4 (Sep. 30, 2011).

* cited by examiner

*Primary Examiner* — Jared Fureman
*Assistant Examiner* — Kevin J Comber

(57) ABSTRACT

Disclosed is a circuit (100) comprising a transistor (110) coupled between a supply voltage line (102) and ground (106), the transistor comprising a control terminal coupled to a input signal line (104), the circuit further comprising first and second bipolar transistors (122, 124) coupled in series between the input signal line (104) and ground (106), wherein the base of the first bipolar transistor is connected to the input signal line and the base of the second bipolar transistor is connected to ground.

8 Claims, 3 Drawing Sheets

ESD PROTECTION CIRCUIT

CROSS-REFERENCE TO RELATED APPLICATIONS

Figure 1:
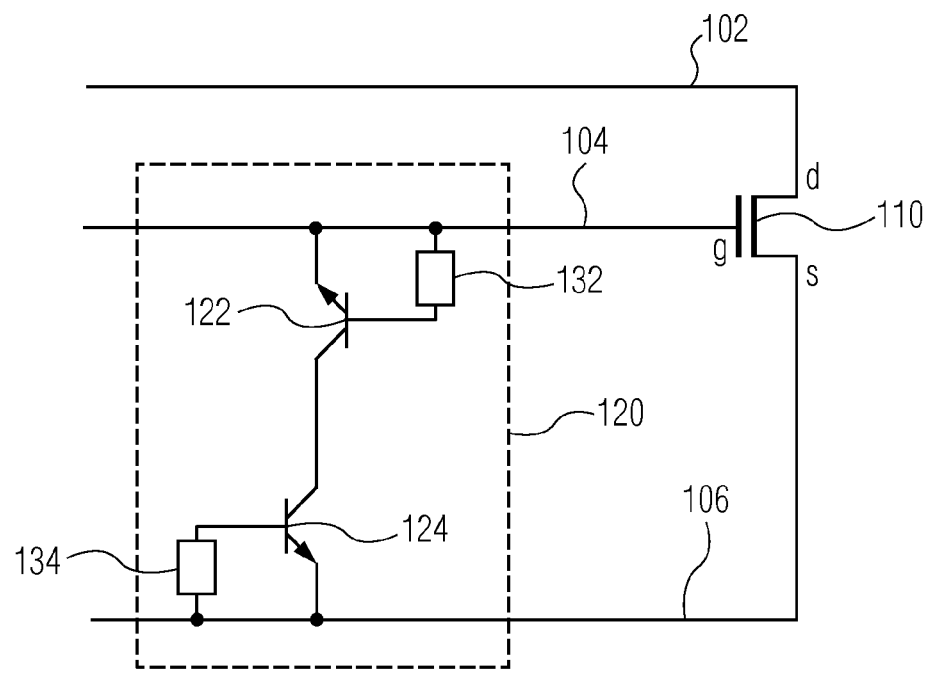

This application claims the priority under 35 U.S.C. §119 of European patent application no. 11163258.4, filed on Apr. 20, 2011, the contents of which are incorporated by reference herein.

FIELD OF THE INVENTION

The present invention relates to a circuit comprising a transistor coupled between a supply voltage line and ground, the transistor comprising a control terminal coupled to an input signal line.

BACKGROUND OF THE INVENTION

ESD (electrostatic discharge) protection is commonly applied to circuits to protect circuit elements from damage in case of an ESD event on a control terminal of the circuit element. For instance, in CMOS circuits the use of so-called grounded gate nMOS (ggNMOS) transistors coupled between the control terminal of the circuit element to be protected and ground are commonly used for such ESD protection. The ggNMOS transistor is typically implemented with a relatively large width to length (W/L) ratio, in which gate, source and base are tied to ground, thereby forming a parasitic bipolar (junction) transistor in which the drain is acting as the collector, the gate/source combination acts as the emitter and the substrate acts as the base. Alternatively, in case of a ggNMOS made in a P-well, the P-well acts as the base.

Upon the occurrence of an ESD event on the input signal line, the collector-base junction of the parasitic NPN bipolar transistor becomes reverse biased to the point of avalanche breakdown, at which point the positive current flowing from the base to the ground induces a voltage to appear across the base-emitter junction, which causes the ggNMOS transistor to enter snapback mode until the energy of the ESD event has been depleted.

A drawback of this approach is that its behavior is asymmetrical, i.e. (intentional) negative voltages occurring on the control terminal of the ggnMOS force this device into a conductive state. This is for instance relevant for RF-LDMOS (laterally diffused metal oxide semiconductor) transistors used in power amplifiers. As these amplifiers may be operated as class AB or class C amplifiers, the RF voltage swing can drive the gate voltage below a certain threshold, e.g. −0.7 V, causing a current to flow through the ESD protection. This can cause problems in a bias circuit connected to the LDMOS transistor.

In addition, in some application domains, such as industrial, scientific and medical applications, there is a requirement to be able to switch the LDMOS to a non-conducting state using a negative DC gate bias. In such a case the RF signal may still exist at the gate but the applied bias ensures that the transistor remains in a switched off state, i.e. is no longer amplifying.

The above requirements may be met using dual-sided ESD protection. For instance, US 2007/0228475 discloses a drain-source junction isolated ESD transistor connected in series with an isolation diode element between the gate control line and ground. The isolation diode element prevents a forward biasing of the drain-source junction of the ESD transistor at a $-V_{gs}$ condition of the transistor device to be protected. Similarly, US 2008/0093624 discloses a back-to-back diode arrangement to provide such dual-sided ESD protection. However, these solutions are unsatisfactory where silicon real estate is at a premium as for such ESD protection circuits typically have a modest current density such that they must cover a relatively large area to be able to sufficiently cope with ESD events. A further drawback of such relatively area intensive solutions is that they increase the capacitance of the ESD circuit, which is also undesirable.

SUMMARY OF THE INVENTION

The present invention seeks to provide a transistor for use in power amplifiers having improved ESD protection.

According to a first aspect of the present invention, there is provided a circuit comprising a transistor coupled between a supply voltage line and ground, the transistor comprising a control terminal coupled to an input signal line, the circuit further comprising first and second bipolar transistors coupled in series between the input signal line and ground, wherein the base of the first bipolar transistor is connected to the input signal line and the base of the second bipolar transistor is connected to ground.

The use of (NPN) bipolar transistors in such a configuration ensures a symmetrical ESD protection, i.e. the ESD protection is triggered at both positive and negative gate-source voltages ($V_{gs}$) of the transistor to be protected, e.g. a RF-LDMOS transistor in a power amplifier. In addition, by providing dual-sided ESD protection implemented with (NPN) bipolar transistors, the ESD protection circuit is capable of handling higher current densities compared to the aforementioned prior art solutions.

In an embodiment, the base of the first bipolar transistor is connected to the input signal line via a first resistor and the base of the second bipolar transistor is connected to ground via a second resistor. The respective resistor values of the resistors may be used to tune the holding voltage of the ESD protection.

Advantageously, the circuit comprises first and second MOS transistors coupled in series between the input signal line and ground, wherein the gate of the first MOS transistor is connected to the input signal line and the gate of the second MOS transistor is connected to ground, and wherein a node between the first bipolar transistor and the second bipolar transistor is connected to a node between the first MOS transistor and the second MOS transistor. Such transistors, which preferably are NMOS transistors and more preferably are n-type LDMOS transistors, act as diodes in parallel to the N-well and P-well diodes of the bipolar transistors. The inclusion of such MOS transistors in the ESD circuit in the vicinity of the bipolar transistors improves the control over the doping profiles of the bipolar transistors.

BRIEF DESCRIPTION OF THE EMBODIMENTS

Figure 2:
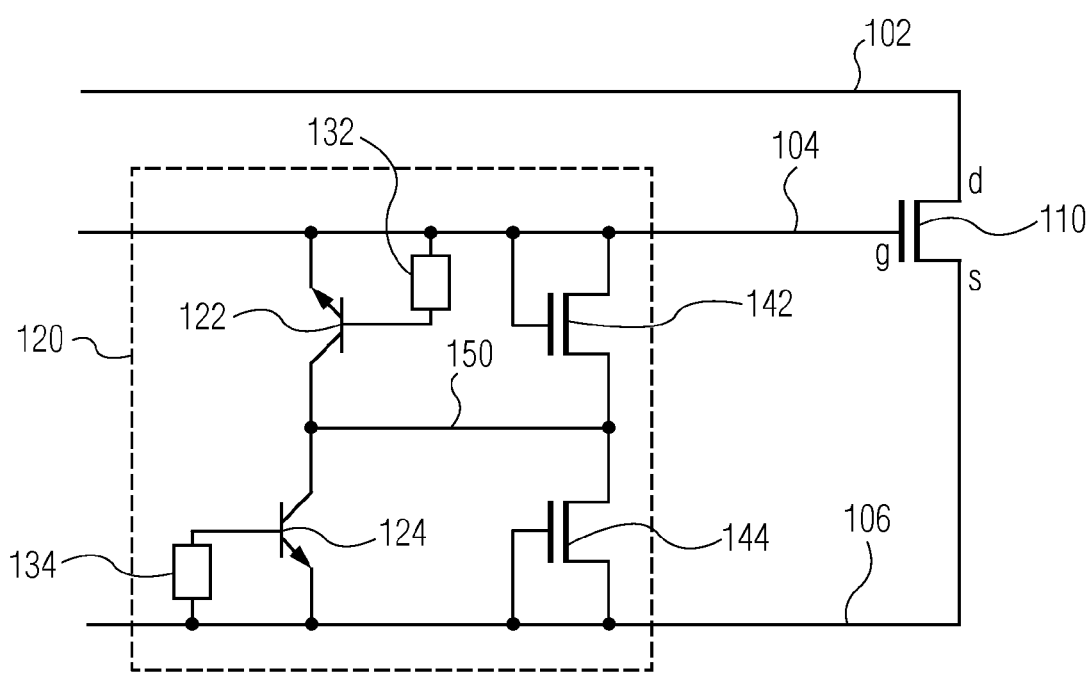
Figure 3:
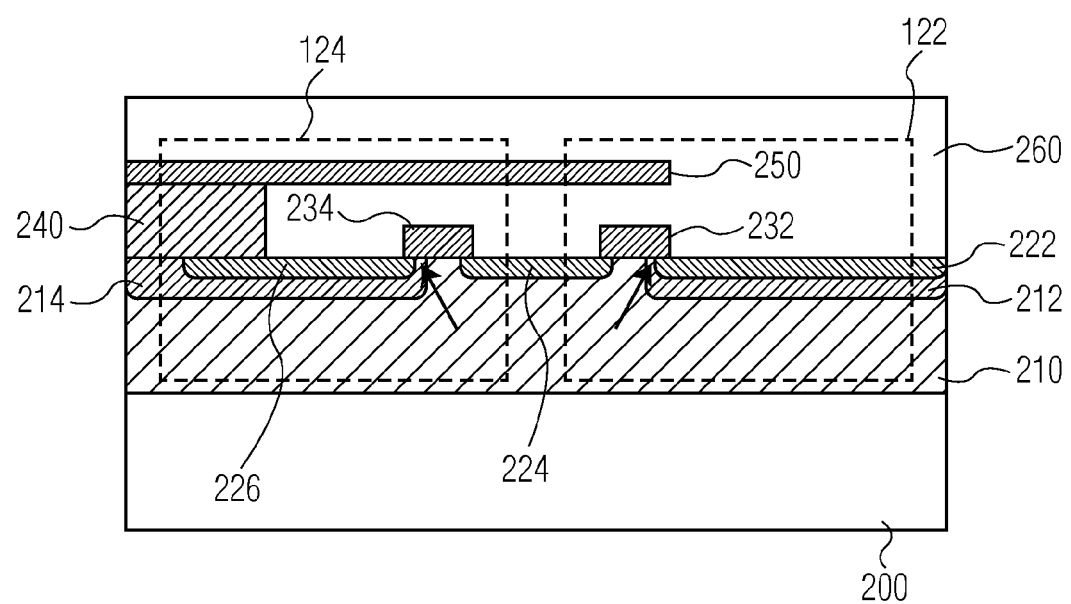
Figure 4:
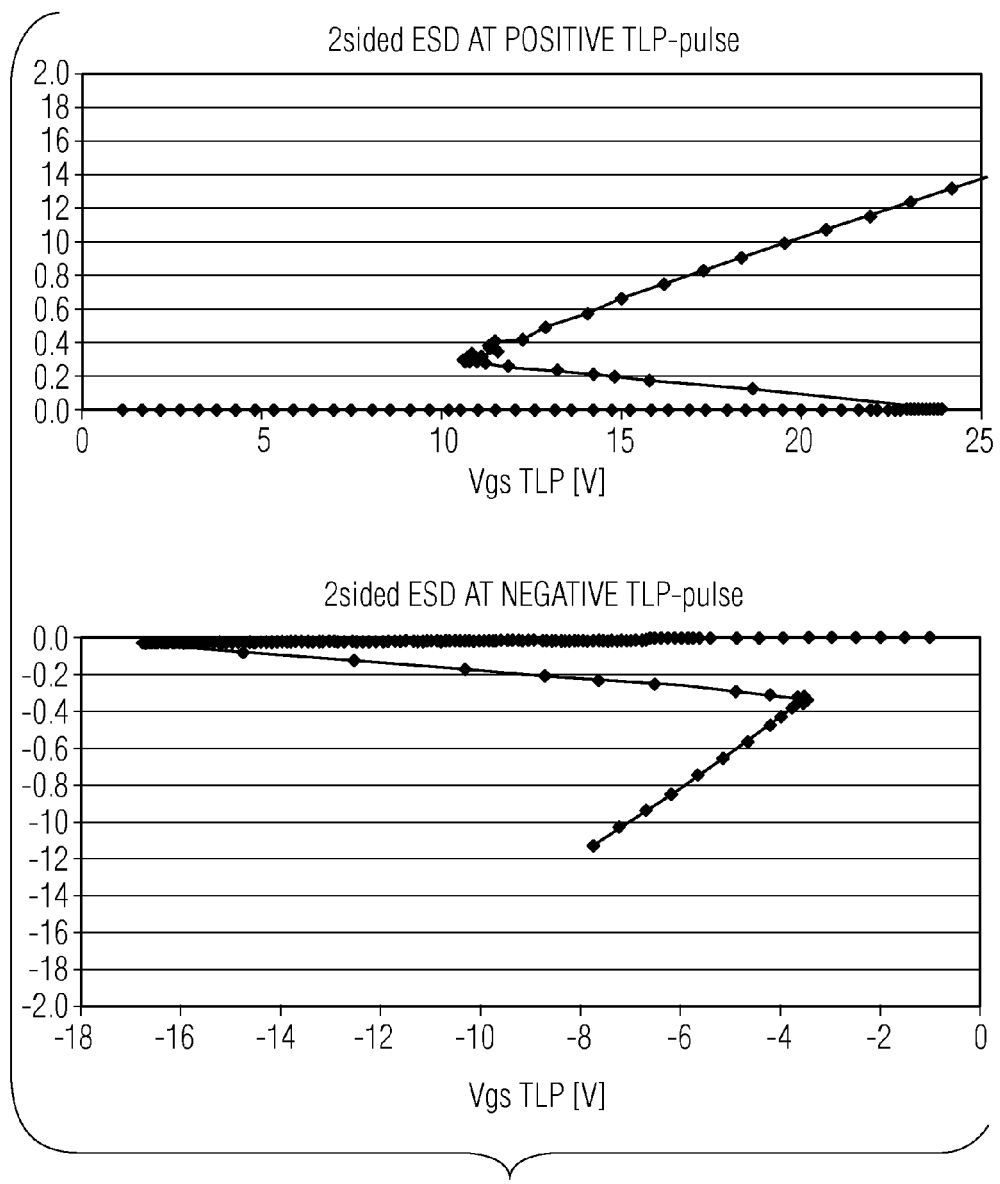

Embodiments of the invention are described in more detail and by way of non-limiting examples with reference to the accompanying drawings, wherein:

FIG. 1 schematically depicts a circuit according to an embodiment of the present invention;

FIG. 2 schematically depicts a circuit according to another embodiment of the present invention;

FIG. 3 schematically depicts an aspect of the layout of a circuit according to an embodiment of the present invention in more detail; and FIG. 4 depicts the measurement results of the ESD protection behavior of a circuit in accordance with an embodiment of the present invention.

DETAILED DESCRIPTION OF THE DRAWINGS

It should be understood that the Figures are merely schematic and are not drawn to scale. It should also be understood that the same reference numerals are used throughout the Figures to indicate the same or similar parts.

FIG. 1 depicts a first embodiment of the present invention, in which an integrated circuit (IC) 100 comprises a transistor 110 that requires ESD protection. The transistor 110 may be any suitable transistor, although the present invention is particularly suitable for protecting transistors 110 in small footprint ICs, such as RF-LDMOS transistors used in power amplifiers. The transistor 110 has a drain d connected to a power supply line 102, e.g. a $V_{ss}$ or $V_{dd}$ supply line, a gate g connected to a control signal line 104, which typically provides the input signal of the IC, e.g. for power amplification purposes, and its source is connected to ground 106. Although the transistor 110 has been shown as a MOS transistor, it will be readily understood by the skilled person that other types of transistors, e.g. bipolar transistors, may also be used as the transistor 110.

The IC 100 further comprises an ESD protection circuit 120 for protecting the transistor 110, e.g. a RF-LDMOS transistor, against an ESD event on the input signal line 104. To this end, the ESD protection circuit 120 comprises a first bipolar junction transistor (BJT) 122 connected in series with a second BJT 124 between the control signal line 104 and ground 106. The control terminal, i.e. base, of the first BJT 122 is connected to the control signal line 104 in addition to the emitter of the BJT 122 and the control terminal, i.e. base, of the second BJT 124 is connected to ground 106 in addition to the emitter of BJT 124. The base of the first BJT 122 may be connected to the control signal line 104 via a first resistor 132 and the base of the second BJT 124 may be connected to ground 106 via a second resistor 134. The first resistor 132 and second resistor 134 may be discrete devices or may be the contact resistance of the connection of the appropriate part of the bipolar transistor, e.g. its P-well, to the metal of the control signal line 104 or ground 106. The advantage of having discrete resistors 132 and 134 is that the resistor value of the resistors can be more easily tuned to set the holding voltage of the ESD protection provided by ESD protection circuit 120. In the context of the present invention, the holding voltage is the voltage to which the ESD protection circuit 120 snaps back.

FIG. 2 shows an alternative embodiment of an IC 100 comprising an ESD protection circuit 120 for its transistor 110. In addition to the circuit shown in FIG. 1, the ESD protection circuit 120 further comprises a first MOS transistor 142 coupled in series with a second MOS transistor 144 in between the input signal line 104 and ground 106. The gate of the first MOS transistor 142 is connected to the input signal line 104 and the gate of the second MOS transistor 144 is connected to ground. The second MOS transistor 144 can be recognized as a grounded gate MOS transistor, in which case the MOS transistors 142 and 144 should be NMOS transistors. In case the transistor 110 also is a MOS transistor, it is preferable that the MOS transistors 142 and 144 are realized as the same type of MOS transistors as the transistor 110 to avoid adding complexity to the IC manufacturing process. For instance, in case of the transistor 110 being an RF-LDMOS transistor forming part of e.g., a power amplifier, it is preferred that the MOS transistors 142 and 144 are also realized as LDMOS transistors. The main advantage of adding MOS transistors 142 and 144 is that their gate structures simplify the formation of the diffusion regions of the bipolar transistors 122 and 124 as they can be used for a self-aligned implantation of these diffusion regions.

A node in between the first BJT 122 and the second BJT 124, e.g. an output, is conductively connected to a node in between the first MOS transistor 142 and the second MOS transistor 144.

FIG. 3 shows an example implementation of the ESD protection circuit 120 of FIG. 2 in a substrate, such as a silicon substrate or another suitable substrate. The substrate 200 comprises an N-well region 210 in which the first BJT 122 and the second BJT 124 are formed. The first BJT 122 comprises an $N^+$-doped region 222 defining the emitter and a P-well 212 defining the base of the BJT 122. A gate 232 of the MOS transistor 142 is provided over the N-well region 210 that laterally extends over the P-well 212 defining the base of the BJT 122 and the $N^+$-doped region 224 connecting the first BJT 122 to the second BJT 124. The second BJT 124 comprises an $N^+$-doped region 226 defining the emitter and a P-well 214 defining the base of the BJT 124, with a gate 234 of the MOS transistor provided over the N-well region 210 that laterally extends over the P-well 214 defining the base of the BJT 124 and the $N^+$-doped region 224 connecting the first BJT 122 to the second BJT 124.

The gates 232 and 234, i.e. the MOS transistors 142 and 144, may be omitted in an alternative embodiment, which would then yield the circuit as shown in FIG. 1. The presence of the MOS transistors 142 and 144 does not significantly alter the behavior of the ESD protection circuit 120, but facilitate the setting of the correct doping levels of the BJTs 122 and 124 when manufactured in a MOS process such as an LDMOS process. However, the doping levels of the BJTs 122 and 124 may be set in any suitable manner, e.g. without using the gates 232 and 234 to implement the $N^+$-regions 222, 224 and 226 in a self-aligned manner.

The P-well 214 is electrically shorted with the $N^+$-region 226 by a high-ohmic portion 240. The P-well 212 is shorted to the $N^+$-region 222 in the same manner, and connected to the control signal line 104. This is not explicitly shown.

An interconnect 250 from the contact 240 to ground 106 (not shown) is also shown for the sake of completeness. The interconnect 250 is typically separated from the doped regions of the BJTs 122 and 124 by an electrically insulating layer 260, e.g. $SiO_2$, $Si_3N_4$ and/or any other suitable dielectric material.

In normal operation, the ESD protection circuit 120 operates as follows. At positive $V_{gs}$ voltages at the RF-gate g of the transistor 110, the P-well 212 to N-well 210 diode is forward biased. This will charge up the floating N-well 210 to a positive voltage. The N-well 210 to substrate 200 diode will be reverse biased, since the substrate is grounded (it will be understood that in this scenario a p-type substrate 210 has been used). The N-well 210 to P-well 214 diode is also reverse biased such that no significant current is flowing through the ESD protection circuit 120, also because the high-contact resistance of the P-well 212 to the control signal line 104 is part of the current path. In contrast, at negative $V_{gs}$ voltages at the control terminal of the transistor 110, the diode from the P-well 212 to N-well 210 is reversed biased, thereby blocking the current such that it can be seen that the ESD protection circuit 120 shows the desired operating behavior for both positive and negative $V_{gs}$ values in the normal operating range.

Upon the occurrence of an ESD event with a positive $V_{gs}$, the ESD protection circuit 120 exhibits the following behavior. With a rising voltage at the control terminal, e.g. RF-gate, of the transistor 110, which is connected to the N+-region 222 and the P-well 212, the diode from the P-well 212 to N-well 210 becomes forward biased. The rising voltage causes the electrical field at the point indicated by the arrow in the second BJT 124 to increase up to the point where holes and electrons are generated by avalanche breakdown. This will trigger the formation of a parasitic NPN-BJT formed by N+-region 226 as the emitter, P-well 214 as the base and N-well 210 as the collector.

Once this parasitic BJT has been formed, a large current will start to flow, thereby causing the voltage of the P-well 212 and the N-well 210 to suddenly decrease (snapback) due to the voltage drop at the high contact resistance at the P-well 212. Consequently, the N+-region 222 to P-well 212 is going into breakdown (~2V), and the large contact resistance of the P-well 212 becomes excluded from the current path.

Upon the occurrence of an ESD event with a negative $V_{gs}$, the ESD protection circuit 120 will exhibit similar behavior due to the symmetry in the design of the ESD protection circuit 120. Upon the voltage $V_{gs}$ going negative at the P-well 212 and the N+-region 222, the electrical field at the point indicated by the arrow in the first BJT 122 increases until at a critical voltage holes and electrons are generated by avalanche breakdown. This will trigger the formation of a parasitic NPN-BJT formed by P-well 212 as the emitter, N+-region 222 as the base and the N-well 210 as the collector. Upon formation of this parasitic BJT, a large current starts to flow. This causes the voltage of P-well 214 and N-well 226 to suddenly go negative due to the voltage drop caused by the high contact resistance at the P-well 214. Now the junction from the substrate 210 to N-well 212 junction becomes forward biased and a large current can continue to flow. If the series resistance in the N-well 210 is high, the diode from the P-well 214 to N+-region 226 will go into breakdown, giving a low resistance path again.

At this point, it is noted that the high contact resistance between P-wells 212 and 214 and the respective contacts may be replaced by discrete resistors 132 and 134 as previously explained. This has the further advantage that a higher doping concentration can be used in the P-wells 212 and 214. However, using the intrinsic high contact resistance of the P-wells 212 and 214 may be advantageous in some manufacturing processes where it is automatically provided by the chosen diffusion processes.

It is further noted that for a negative $V_{gs}$ ESD event an alternative triggering of the ESD protection may be realized, depending on the actual doping levels in the P-wells 212, 214 and the N+-regions 222 and 226. Upon voltage $V_{gs}$ going negative at P-well 212 and N+-region 222, the electrical field at the point as indicated by the arrow in BJT 124 is increasing, and at some critical voltage value, holes and electrons will be generated by avalanche breakdown. This can trigger a parasitic PNP-BJT formed by P-well 214 as emitter, N-well 210 as base and P-well 212 as collector. Upon the formation of this PNP-BJT, the junction from the P-well 212 to N+-region 222 will go into breakdown, again providing a current path bypassing the high contact resistance to the P-well 212.

The robustness of the dual-sided symmetrical ESD protection circuit 120 has been tested for an IC 100 manufactured in LDMOS technology with transistor 110 implemented as a 50V HV-LDMOS transistor of a power amplifier, which can deliver 1.2kW RF power, in accordance with present market demands.

The ESD performance of this circuit 100 has been tested using the well-known transmission line pulse (TLP) setup, in which the circuit is subjected to a pulsed I-V curve, and a leakage current measurement is performed after each pulse to determine in the circuit has survived the current pulse. The maximum current before failure is a measure for the ESD protection performance of the circuit. For power amplifiers, a TLP current of around 1.2 A is used, which corresponds to a human body model (HBM) voltage of 2 kV, which is commonly used as an ESD specification for RF-LDMOS devices.

FIG. 4 shows the test results for a positive $V_{gs}$ ESD event (top pane) and negative $V_{gs}$ event (bottom pane). In the positive test, the ESD protection of the circuit 100 was triggered at 25V, with a holding voltage of 12V. In the negative test, the ESD protection of the circuit 100 was triggered at −16V, with a holding voltage of −3V. As can be seen from FIG. 4, the ESD performance of the ESD circuit 120 is more than adequate for coping with ESD events of around 1.2 A as no device failure was observed at these currents.

The circuit 100 of the present invention may be integrated in any suitable IC. A particularly advantageous embodiment of such an IC is an IC for processing RF signals and including a power amplifier for amplifying such signals, e.g. a RF-LDMOS as previously explained. Such an IC may be included in any suitable electronic device, such as a device for processing RF signals, e.g.

a mobile phone, a global positioning by satellite (GPS) device, a personal digital assistant, and so on.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. Circuit comprising:
    a transistor coupled between a supply voltage line and ground, the transistor comprising a control terminal coupled to an input signal line, and
    first and second bipolar transistors coupled in series between the input signal line and ground, the first bipolar transistor having a base and the second bipolar transistor having a base
    wherein the base of the first bipolar transistor is connected to the input signal line and the base of the second bipolar transistor is connected to ground;
    first and second MOS transistors coupled in series between the input signal line and ground, the first MOS transistor having a gate and the second MOS transistor having a gate:
    wherein the gate of the first MOS transistor is connected to the input signal line and gate of the second MOS transistor is connected to ground, and wherein a node between the first bipolar transistor and the second bipolar transistor is connected to a node between the first MOS transistor and the second MOS transistor.

2. The circuit of claim 1, wherein the base of the first bipolar transistor is connected to the input signal line via a first resistor and the base of the second bipolar transistor is connected to ground via a second resistor.

3. The circuit of claim 1, wherein the first and second bipolar transistors share an $N^+$-region.

4. The circuit of claim 1, wherein said MOS transistors are LDMOS transistors.

5. The circuit of claim 4 wherein the LDMOS transistor is adapted to amplify RF signals.

6. An integrated circuit comprising the circuit of claim 1.

7. The integrated circuit of claim 6, wherein the circuit forms part of a power amplifier.

8. An electronic device comprising the integrated circuit of claim 6.

\* \* \* \* \*